United States Patent
Ando

(10) Patent No.: US 11,329,572 B2
(45) Date of Patent: May 10, 2022

(54) SEMICONDUCTOR DEVICE

(71) Applicant: ROHM CO., LTD., Kyoto (JP)

(72) Inventor: Motohiro Ando, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 17/037,150

(22) Filed: Sep. 29, 2020

(65) Prior Publication Data

US 2021/0028716 A1 Jan. 28, 2021

Related U.S. Application Data

(63) Continuation of application No. 16/307,398, filed as application No. PCT/JP2017/023677 on Jun. 28, 2017, now Pat. No. 10,833,595.

(30) Foreign Application Priority Data

Jul. 1, 2016 (JP) ................................. 2016-131539

(51) Int. Cl.
*H02M 7/537* (2006.01)
*H02M 7/00* (2006.01)
(Continued)

(52) U.S. Cl.
CPC ............. *H02M 7/003* (2013.01); *H02M 7/48* (2013.01); *H02M 7/537* (2013.01); *H02P 27/06* (2013.01); *H05K 1/181* (2013.01)

(58) Field of Classification Search
CPC ........ H02M 7/003; H02M 7/48; H02M 7/537; H02M 3/003; H02P 27/06; H05K 1/181; H01L 2224/48139; H01L 2224/48247
See application file for complete search history.

(56) References Cited

U.S. PATENT DOCUMENTS 6,654,262 B2 * 11/2003 Hussein .................. H02M 1/36
363/49
2007/0218595 A1 * 9/2007 Yoshimura .............. H02M 1/08
438/138
(Continued)

FOREIGN PATENT DOCUMENTS

CN 103915425 7/2014
JP 2001-156252 6/2001
(Continued)

OTHER PUBLICATIONS

International Search Report issued in International Application No. PCT/JP2017/023677, dated Aug. 29, 2017, 5 pages.
(Continued)

*Primary Examiner* — Muhammad S Islam
(74) *Attorney, Agent, or Firm* — Hamre, Schumann, Mueller & Larson, P.C.

(57) ABSTRACT

Provided is a semiconductor device that has a configuration provided with: a driving unit for driving an upper switching element and a lower switching element according to a control signal for controlling the driving of the upper switching element and the lower switching element, which are connected in series to constitute a bridge circuit; an insulating unit having an insulating transformer; and a package for sealing at least a part of the insulating unit and the driving unit. The insulating unit transmits a signal corresponding to the control signal to the driving unit side while insulating the signal.

26 Claims, 9 Drawing Sheets

(51) Int. Cl.
  *H02P 27/06* (2006.01)
  *H05K 1/18* (2006.01)
  *H02M 7/48* (2007.01)

(56) References Cited

U.S. PATENT DOCUMENTS

| | | | | |
|---|---|---|---|---|
| 2011/0051296 | A1* | 3/2011 | Ando | H03K 17/166 361/18 |
| 2012/0020419 | A1* | 1/2012 | Kaeriyama | H04L 25/4902 375/259 |
| 2012/0212075 | A1* | 8/2012 | Arnet | H02M 1/08 307/113 |
| 2012/0212863 | A1* | 8/2012 | Ando | H02H 7/222 361/45 |
| 2014/0184303 | A1* | 7/2014 | Hasegawa | H03K 17/567 327/377 |
| 2014/0374890 | A1* | 12/2014 | Yamashita | H01L 23/4952 257/670 |
| 2016/0365721 | A1* | 12/2016 | Soma | H03K 19/017509 |
| 2017/0323848 | A1 | 11/2017 | Yamashita et al. | |
| 2017/0358522 | A1* | 12/2017 | Nakamura | H01L 23/49568 |

FOREIGN PATENT DOCUMENTS

| | | |
|---|---|---|
| JP | 2006-165409 | 6/2006 |
| JP | 2009-232637 | 10/2009 |
| JP | 2009-267071 | 11/2009 |
| JP | 2010-263571 | 11/2010 |
| JP | 2010-263671 | 11/2010 |
| JP | 2013-055739 | 3/2013 |
| JP | 2014-130909 | 7/2014 |
| JP | 2015-008229 | 1/2015 |
| JP | 2015-515242 | 5/2015 |

OTHER PUBLICATIONS

Extended European Search Report issued in corresponding European Application No. 17820181.0, dated Dec. 20, 2019, 10 pages.
Office Action issued on corresponding Japanese Patent Application No. 2020-002875, dated Mar. 30, 2021, 5 pages w/translation.

* cited by examiner

SEMICONDUCTOR DEVICE

TECHNICAL FIELD

The present invention relates to a semiconductor device.

BACKGROUND ART

Conventionally, inverters which are electric power conversion devices that convert DC power to AC power are used for driving motors incorporated in various devices, and are used in power supplies (such as power conditioners).

Conventionally, there are known IPMs (intelligent power modules) in which an inverter, including a power device such as an IGBT (insulated-gate bipolar transistor) or a MOSFET (metal-oxide-semiconductor field-effect transistor) and a driver IC which drives the power device, is enclosed in a single package. In the electric power conversion devices that use a high voltage, it is often necessary to isolate signals in an input section and a main circuit in a high-voltage section so as to prevent electric shock.

FIG. 9 is a diagram showing an outline of an example of a configuration of a conventional inverter system in which an IPM is mounted on a printed circuit board. The inverter system 110 shown in FIG. 9 includes an MCU (micro control unit) 101, photocouplers 102A to 102F, a photocoupler 103, an IPM 104, and a printed circuit board (PCB) 105.

The MCU 101, the photocouplers 102A to 102F, the photocoupler 103, and the IPM 104 are mounted on the printed circuit board 105, for example, by soldering.

The MCU 101 transmits control signals Sci1 to Sci6 respectively to the photocouplers 102A to 102F which provide relatively fast response. The photocouplers 102A to 102F deliver, while electrically isolating, the received control signals Sci1 to Sci6 as control signals Sco1 to Sco6 to the IPM 104.

The IPM 104 functions as a motor driver which drives a three-phase brushless DC motor (unillustrated), and has three bridge structures (unillustrated) each formed with an upper switching device and a lower switching device each configured as an IGBT or the like. In the IPM 104, based on the received control signals Sco1 to Sco6, the driver IC drives the upper switching devices and the lower switching devices. In this way, the IPM 104 operates as an inverter.

From the IPM 104, a fault signal Fti is transmitted to the photocoupler 103 which provides relatively slow response. The fault signal Fti is transmitted when a fault occurs such as an overcurrent or an overheated state. The photocoupler 103 delivers, while electrically isolating, the received fault signal Fti as a fault signal Fto to the MCU 101. In this way, the fault state can be notified to the MCU 101.

LIST OF CITATIONS

Patent Literature

Patent Document 1: JP-A-2001-156252

SUMMARY OF THE INVENTION

Technical Problem

Thus, the configuration of the conventional inverter system 110 shown in FIG. 9, in which the photocouplers 102A to 102F and 103 are arranged between the MCU 101 on the low-voltage side and the IPM 104 on the high-voltage side, achieves signal isolation for control signals and a fault signal, and prevents malfunction and failure of the MCU 101. Such a configuration of the inverter system 110, however, increases the size of the printed circuit board 105 with an increase of the substrate mounting area resulting from the reasons given below, and thus hinders the system from achieving compactness.

One of the reasons for the above-mentioned problem is that the photocouplers need to have a terminal creepage distance secured for isolation, and this increases the size of the package of the photocouplers. Another reason is that the same number of photocouplers as that of signals need to be provided. In the example of the inverter system 110, seven photocouplers are required. Yet another reason is that the photocouplers require external capacitors for power supply. Still another reason is that an isolation distance needs to be secured between wiring patterns on the printed circuit board 105.

Patent Document 1 discloses a configuration in which a printed circuit board is arranged on an IPM, and photocouplers for isolating PWM signals are mounted on the printed circuit board. Even such a conventional configuration has problems similar to those mentioned above.

Devised against the background discussed above, an object of the present invention is to provide a semiconductor device that offers a compact system by reducing the substrate mounting area.

Means for Solving the Problem

To achieve the above object, according to one aspect of the present invention, a semiconductor device includes: a driver configured to drive, according to a control signal for controlling driving of an upper switching device and a lower switching device connected in series to together constitute a bridge circuit, the upper switching device and the lower switching device; an insulator having an isolation transformer; and a package in which at least part of the insulator and part of the driver are sealed. The insulator is configured to transmit a signal corresponding to the control signal to the driver while isolating the signal (a first configuration).

In the semiconductor device according to the first configuration, the driver can include an upper driver configured to drive the upper switching device and a lower driver configured to drive the lower switching device. The insulator can be arranged at a position between, and on the same plane as, the upper driver and the lower driver (a second configuration).

The semiconductor device according to the first or second configuration can further include: a transmitter configured to generate a pulse signal based on the received control signal to output the pulse signal to the insulator (a third configuration).

In the semiconductor device according to any one of the first to third configurations, the driver can be configured to transmit a detection signal that reflects a driving state to the insulator. The insulator can be configured to transmit, while isolating, the detection signal to outside the device (a fourth configuration).

In the semiconductor device according to the fourth configuration, the driver can further include a transmitter configured to generate a pulse signal based on the received detection signal to output the pulse signal to the insulator (a fifth configuration).

The semiconductor device according to the fourth or fifth configuration can further include: a receiver configured to generate a signal based on a pulse output fed from the insulator to transmit the signal to outside the device (a sixth configuration).

In the semiconductor device according to any one of the first to sixth configurations, the insulator can further include: a first coil formed on the surface of an insulating substrate having a semiconductor layer or in the insulating substrate; and a second coil formed opposite the first coil across a dielectric member (a seventh configuration).

In the semiconductor device according to the seventh configuration, the first coil and the second coil can be arranged over one another in a plan view (an eighth configuration).

In the semiconductor device according to any one of the first to eighth configurations, the insulator and the driver can each be configured as a chip (a ninth configuration).

In the semiconductor device according to any one of the first to ninth configurations, the upper switching device and the lower switching device can be IGBTs or MOSFETs with a Si substrate, or IGBTs or MOSFETs with a SiC substrate or a wide-bandgap type semiconductor substrate (a tenth configuration).

According to another aspect of the present invention, an inverter system includes: the semiconductor device of any one of the first to tenth configurations; a controller configured to transmit a control signal to the semiconductor device; and a circuit board on which the semiconductor device and the controller are mounted (an eleventh configuration).

According to yet another aspect of the present invention, a device includes: the above-mentioned inverter system; and a motor driven by the inverter system (a twelfth configuration).

According to a further aspect of the present invention, an electric power conversion device configured to perform electric power conversion by driving an upper switching device and a lower switching device connected in series to together constitute a bridge circuit includes: first and second drive circuit chips configured to drive the upper switching device and the lower switching device based on a signal corresponding to a control signal fed in from outside; an insulating chip configured to isolate, with an isolation transformer, between the control signal and the signal for driving the first and second drive circuit chips; a circuit board on which at least the insulating chip is mounted; and a package in which at least part of the circuit board, part of the insulating chip, and part of the first and second drive circuit chips are sealed. The insulating chip is arranged in a region between the first and second drive circuit chips in a plan view (a thirteenth configuration).

In the electric power conversion device according to the thirteenth configuration, the insulating chip can include: a first coil formed on the surface of an insulating substrate having a semiconductor layer or in the insulating substrate; and a second coil formed on the surface of a dielectric member or in the dielectric member so as to be opposite the first coil across the dielectric member (a fourteenth configuration).

In the electric power conversion device according to the thirteenth or fourteenth configuration, the circuit board can include a metal island connected to a lead terminal (a fifteenth configuration).

In the electric power conversion device according to the thirteenth or fourteenth configuration, the circuit board can include an insulating printed circuit board (a sixteenth configuration).

In the electric power conversion device according to the thirteenth or fourteenth configuration, the circuit board can include a metal island connected to a lead terminal and an insulating printed circuit board (a seventeenth configuration).

In the electric power conversion device according to any one of the thirteen to seventeenth configurations, the circuit board can further have mounted thereon a transmission-reception chip configured to transmit and receive the control signal (an eighteenth configuration).

In the electric power conversion device according to any one of the thirteen to eighteenth configurations, the first and second drive circuit chips can be mounted on a shared island (a nineteenth configuration).

Advantageous Effects of the Invention

With a present invention, it is possible to reduce the size of the system by reducing the substrate mounting area.

DESCRIPTION OF EMBODIMENTS

An embodiment of the present invention will be described below with reference to the accompanying drawings.

<Configuration of an Inverter System>

Figure 1:
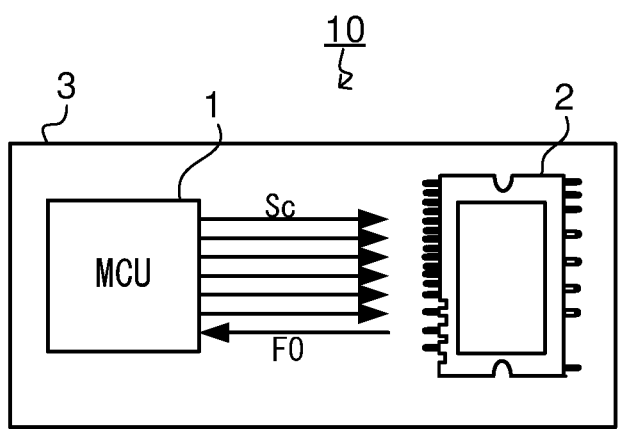
FIG. 1 is a diagram showing an outline of a configuration of an inverter system according to one embodiment of the present invention.

FIG. 1 is a diagram showing an outline of the configuration of an inverter system according to one embodiment of the present invention. The inverter system 10 shown in FIG. 1 includes an MCU 1, an IPM 2, and a printed circuit board 3. The MCU 1 and the IPM 2 are mounted on the printed circuit board 3, for example, by soldering.

The IPM 2 functions as an inverter that drives an unillustrated three-phase brushless DC motor (a motor 15, which will be described later). The MCU 1 transmits six control signals Sc to the IPM 2. The IPM 2 operates as an inverter based on the received control signals Sc. The IPM 2 transmits a fault signal FO to the MCU 1 when a fault occurs. In the inverter system 10, a configuration is adopted in which signal isolation for the control signals Sc and the fault signal FO is provided within the IPM 2. This prevents malfunction or failure of the low voltage-side MCU 1 caused by the high voltage-side IPM 2.

<Configuration of an IPM>

Figure 2:
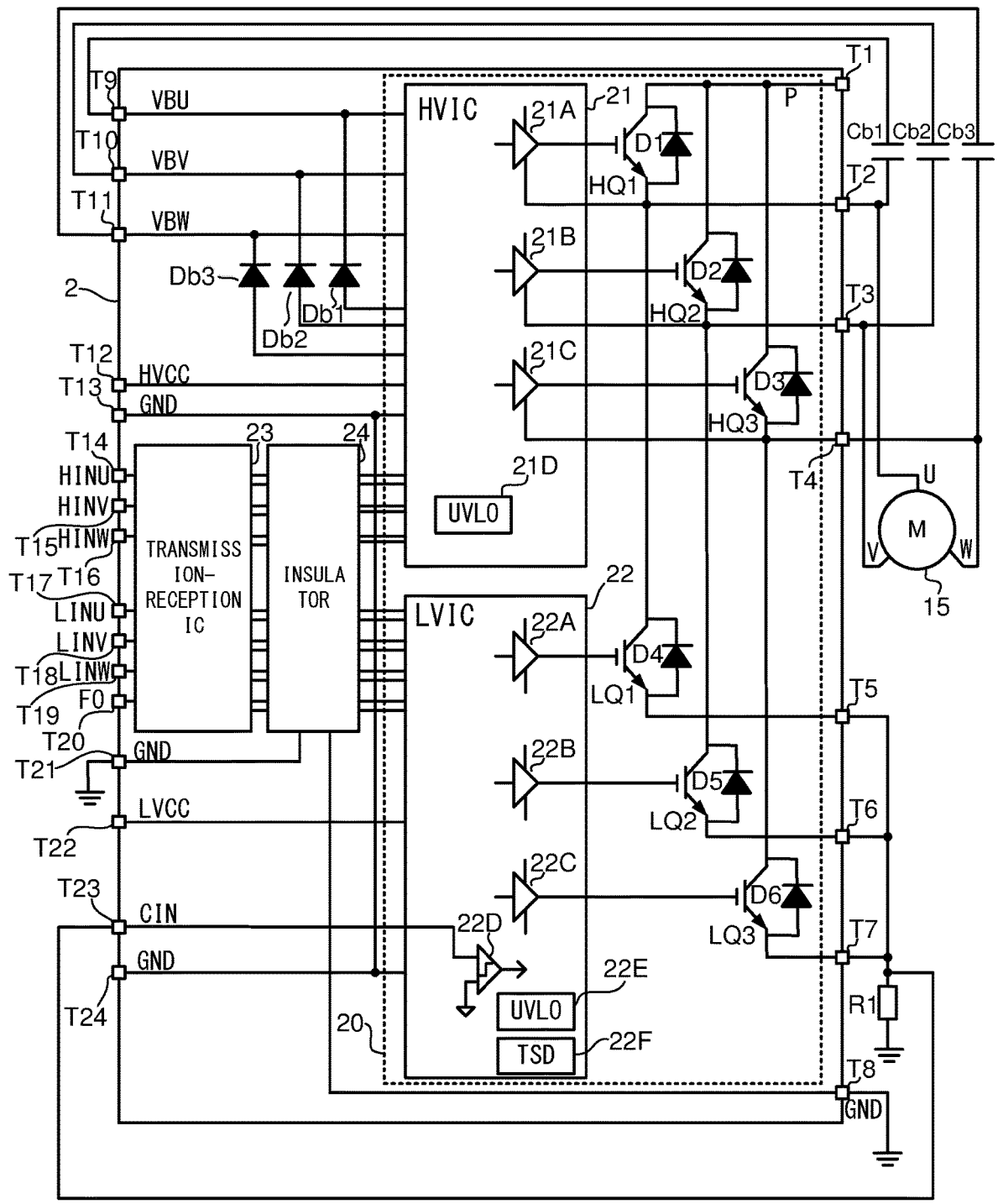
FIG. 2 is a diagram showing a circuit configuration of an IPM according to one embodiment of the present invention.

Next, the configuration of the IPM 2 (semiconductor package) according to one embodiment of the present invention will be described with reference to FIG. 2. FIG. 2 is a diagram showing a specific circuit configuration of the IPM 2.

As shown in FIG. 2, the IPM 2 includes an inverter 20, a transmission-reception IC 23, an insulator 24, and bootstrap diodes Db1 to Db3. These constituent elements are enclosed in a single package. The IPM 2 further includes external terminals T1 to T24 for establishing electrical connection with the outside.

The inverter 20 includes an upper driver IC 21, a lower driver IC 22, a first upper switching device HQ1, a second upper switching device HQ2, a third upper switching device HQ3, a first lower switching device LQ1, a second lower switching device LQ2, a third lower switching device LQ3, and diodes D1 to D6. The upper driver IC 21 and the lower driver IC 22 together constitute a driver.

The first upper switching device HQ1, the second upper switching device HQ2, the third upper switching device HQ3, the first lower switching device LQ1, the second lower switching device LQ2, and the third lower switching device LQ3 are each configured as an IGBT with a Si (silicon) substrate. These switching devices are not limited to IGBTs; instead, they may be configured as MOSFETs with a Si substrate, or may be configured as IGBTs or MOSFETs with a SiC substrate or what is called a wide-bandgap type semiconductor substrate.

To the external terminal T1, a relatively high supply voltage P (for example, 600 V) is applied. The collector of the first upper switching device HQ1 is connected with the external terminal T1. The emitter of the first upper switching device HQ1 is connected to the collector of the first lower switching device LQ1. The emitter of the first lower switching device LQ1 is connected to one end of a resistor R1 via the external terminal T5. Thus, the first upper switching device HQ1 and the first lower switching device LQ1 are connected in series to together constitute a first bridge.

The collector of the second upper switching device HQ2 is connected with the external terminal T1. The emitter of the second upper switching device HQ2 is connected to the collector of the second lower switching device LQ2. The emitter of the second lower switching device LQ2 is connected to the one end of the resistor R1 via the external terminal T6. Thus, the second upper switching device HQ2 and the second lower switching device LQ2 are connected in series to together constitute a second bridge.

The collector of the third upper switching device HQ3 is connected with the external terminal T1. The emitter of the third upper switching device HQ3 is connected to the collector of the third lower switching device LQ3. The emitter of the third lower switching device LQ3 is connected to the one end of the resistor R1 via the external terminal T7. Thus, the third upper switching device HQ3 and the third lower switching device LQ3 are connected in series to together constitute a third bridge.

The other end of the resistor R1 is connected to a ground terminal.

The diodes D1 to D6 are flywheel diodes (FWDs). The cathode of the diode D1 is connected to the collector of the first upper switching device HQ1. The anode of the diode D1 is connected to the emitter of the first upper switching device HQ1. The same applies to the interconnection between the diodes D2 to D6 and other switching devices. That is, each of the diodes D1 to D6 and the corresponding switching device are connected in reverse parallel with each other respectively.

The emitter of the first upper switching device HQ1 is connected via the external terminal T2 to the U-phase terminal of the motor 15, which is a three-phase brushless DC motor. The emitter of the second upper switching device HQ2 is connected via the external terminal T3 to the V-phase terminal of the motor 15. The emitter of the third upper switching device HQ3 is connected via the external terminal T4 to the W-phase terminal of the motor 15.

Capacitors Cb1 to Cb3 are for bootstrapping. One end of the capacitor Cb1 is connected to the external terminal T2. The other end of the capacitor Cb1 is connected via the exterior terminal T9 to the cathode of the diode Db1. The anode of the diode Db1 is connected to a terminal of the upper driver IC 21. One end of the capacitor Cb2 is connected to the external terminal T3. The other end of the capacitor Cb2 is connected via the external terminal T10 to the cathode of the diode Db2. The anode of the diode Db2 is connected to a terminal of the upper driver IC 21. One end of the capacitor Cb3 is connected to the external terminal T4. The other end of the capacitor Cb3 is connected via the external terminal T11 to the cathode of the diode Db3. The anode of the diode Db3 is connected to a terminal of the upper driver IC 21.

From the outside via the external terminal T12, a supply voltage HVCC (for example, 15V) is applied to the upper driver IC 21. From the outside via the external terminal T13, a ground potential is applied to the upper driver IC 21.

The upper driver IC 21 includes a first driver 21A for driving the first upper switching device HQ1, a second driver 21B for driving the second upper switching device HQ2, and a third driver 21C for driving the third upper switching device HQ3.

The upper driver IC 21 charges the capacitor Cb1 with the supply voltage HVCC via the diode Db1, and thereby generates at the external terminal T9 a voltage VBU which is higher than the supply voltage P. Then, the first driver 21A applies the voltage VBU to a gate of the first upper switching device HQ1 to turn on the first upper switching device HQ1.

Likewise, the upper driver IC 21 charges the capacitor Cb2 with the supply voltage HVCC via the diode Db2, and thereby generates at the external terminal T10 a voltage VBV which is higher than the supply voltage P. Then, the second driver 21B applies the voltage VBV to a gate of the second upper switching device HQ2 to turn on the second upper switching device HQ2.

Likewise, the upper driver IC 21 charges the capacitor Cb3 with the supply voltage HVCC via the diode Db3, and thereby generates at the external terminal T11 a voltage VBW which is higher than the supply voltage P. Then, the third driver 21C applies the voltage VBW to a gate of the third upper switching device HQ3 to turn on the third upper switching device HQ3.

The first driver 21A, the second driver 21B, and the third driver 21C short-circuit respectively between the gate and emitter of the first upper switching device HQ1, between the gate and emitter of the second upper switching device HQ2, and between the gate and emitter of the third upper switching device HQ3, and thereby turn off the corresponding switching devices.

The lower driver IC 22 includes a first driver 22A, a second driver 22B, and a third driver 22C. To the lower driver IC 22, a supply voltage LVCC (for example, 15V) is applied from the outside via the external terminal T22 and a ground potential is applied from the outside via the external terminal T24.

The first driver 22A applies the supply voltage LVCC to a gate of the first lower switching device LQ1, and thereby turns on the first lower switching device LQ1. The second driver 22B applies the supply voltage LVCC to a gate of the second lower switching device LQ2, and thereby turns on the second lower switching device LQ2. The third driver 22C applies the supply voltage LVCC to a gate of the third lower switching device LQ3, and thereby turns on the third lower switching device LQ3.

The first driver 22A, the second driver 22B, and the third driver 22C short-circuit respectively between the ground potential and the gate of the first lower switching device LQ1, between the ground potential and the gate of the second lower switching device LQ2, and between the ground potential and the gate of the third lower switching device LQ3, and thereby turn off the corresponding switching devices.

As the upper driver IC 21 and the lower driver IC 22 drive the switching devices to turn on and off as described above, an electric current is fed to the motor 15 via the U-phase terminal, the V-phase terminal, and the W-phase terminal of the motor 15, and the rotor of the motor 15 is driven to rotate.

A UVLO (under voltage lock out) circuit 21D included in the upper driver IC 21 monitors the voltages VBU, VBV, and VBW.

The lower driver IC 22 further includes a comparator 22D, a UVLO circuit 22E, and a TSD (thermal shut down) circuit 22F. A current detection signal CIN which is obtained by converting an electric current passing through the resistor R1 into a voltage signal is applied to the non-inverting input terminal (+) of the comparator 22D via the external terminal T23. To the inverting input terminal (−) of the comparator 22D, a predetermined reference voltage is applied. When the current detection signal CIN reaches the reference voltage, the comparator 22D determines that an overcurrent is occurring, and outputs a high-level detection signal. At this time, the lower switching devices are turned off by the first to third drivers 22A to 22C.

The UVLO circuit 22E monitors the supply voltage LVCC. The TSD circuit 22F monitors the chip temperature of the lower driver IC 22. When the chip temperature is higher than a predetermined temperature threshold value (for example, 175° C.), the TSD circuit 22F outputs a detection signal indicating that. At this time, the lower switching devices are turned off by the first to third drivers 22A to 22C.

<Configuration of Signal Isolation>

The six control signals Sc transmitted from the MCU 1 shown in FIG. 1 are, specifically, control signals HINU, HINV, HINW, LINU, LINV, and LINW as shown in FIG. 2. The control signals HINU, HINV, and HINW fed in via the external terminals T14 to T16 respectively are received by the transmission-reception IC 23, are then delivered to the insulator 24, and are then transmitted to the upper driver IC 21 while being electrically isolated by the insulator 24. The first driver 21A drives the first upper switching device HQ1 to turn on and off based on the control signal HINU. The second driver 21B drives the second upper switching device HQ2 to turn on and off based on the control signal HINV. The third driver 21C drives the third upper switching device HQ3 to turn on and off based on the control signal HINW.

The control signals LINU, LINV, and LINW fed in via the external terminals T17 to T19 respectively are received by the transmission-reception IC 23, are then delivered to the insulator 24, and are then transmitted to the lower driver IC 22 while being electrically isolated by the insulator 24. The first driver 22A drives the first lower switching device LQ1 to turn on and off based on the control signal LINU. The second driver 22B drives the second lower switching device LQ2 to turn on and off based on the control signal LINV. The third driver 22C drives the third lower switching device LQ3 to turn on and off based on the control signal LINW.

When the comparator 22D detects an overcurrent or when the TSD circuit 22F detects an overheated state, a fault signal with a logic level indicating the fault state is fed out to the insulator 24 by the lower driver IC 22. The fault signal is transmitted to the transmission-reception IC 23 while being electrically isolated by the insulator 24, and is then transmitted as the fault signal FO by the transmission-reception IC 23 via the external terminal T20 to the outside to the MCU 1 (FIG. 1). Thus, it is possible to notify the fault state to the MCU 1.

Figure 3:
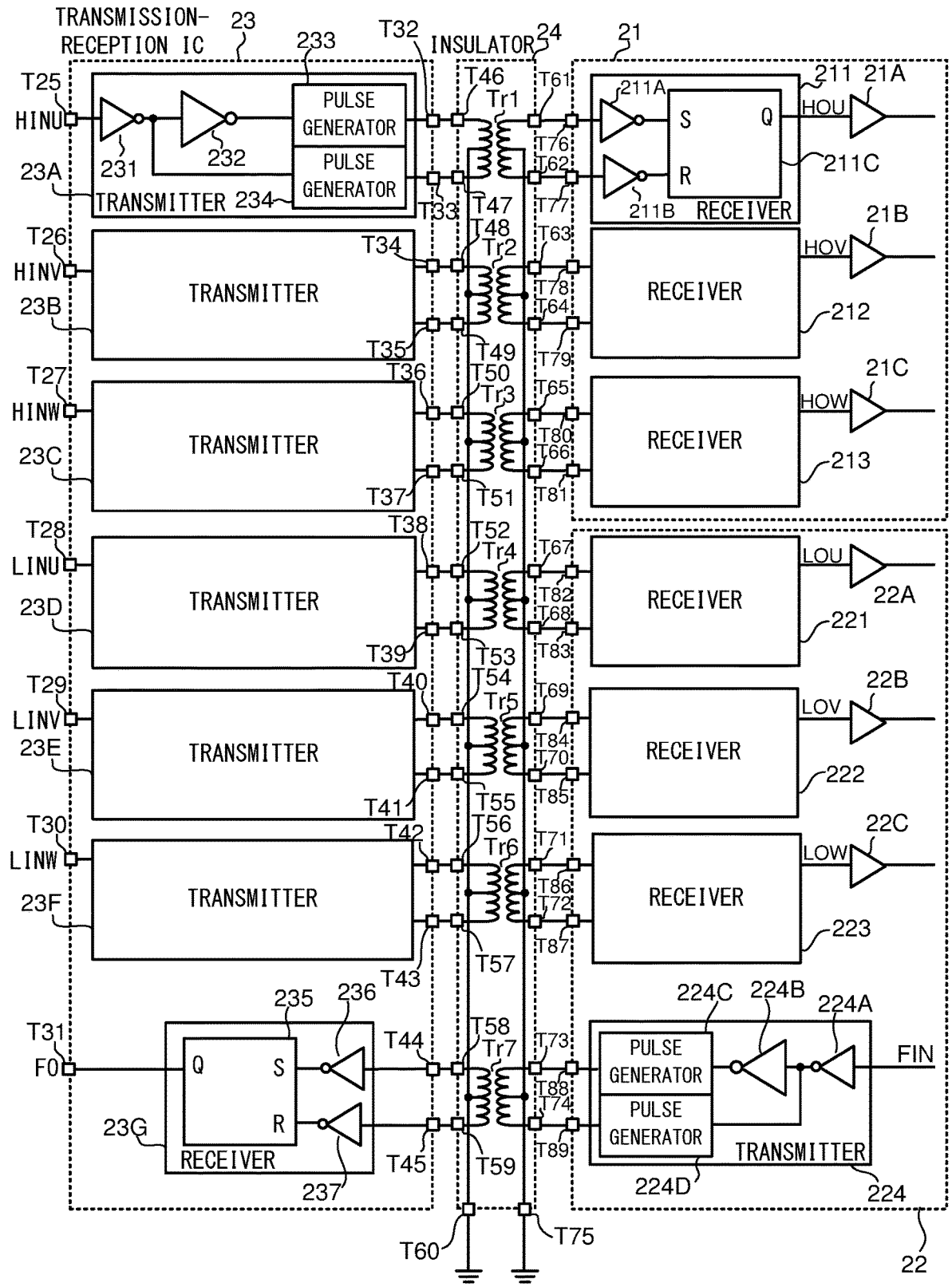
FIG. 3 is a diagram showing a configuration of a transmission-reception IC and an insulator according to one embodiment of the present invention.

Now, the configuration of the transmission-reception IC 23 and the insulator 24 will be described in detail with reference to FIG. 3. FIG. 3 is a diagram showing a specific circuit configuration of the transmission-reception IC 23 and the insulator 24.

As shown in FIG. 3, the transmission-reception IC 23 includes transmitters 23A to 23F which transmit signals to isolation transformers Tr1 to Tr6, and a receiver 23G which receives a signal from an isolation transformer Tr7. The transmission-reception IC 23 is an IC chip having these constituent elements integrated into a single chip. The transmission-reception IC 23 further includes terminals T25 to T45. To the terminals T25 to T30, the control signals HINU, HINV, HINW, LINU, LINV and LINW are fed via the external terminals T14 to T19 respectively.

The insulator 24 is an IC chip having the isolation transformers Tr1 to Tr7 integrated into a single chip. The insulator 24 further includes terminals T46 to T75.

The upper driver IC 21 includes, in addition to the first driver 21A, the second driver 21B, and the third driver 21C, receivers 211 to 213 which receive signals from the isolation transformers Tr1 to Tr3 respectively. The upper driver IC 21 further includes terminals T76 to T81.

The lower driver IC 22 includes, in addition to the first driver 22A, the second driver 22B, and the third driver 22C, receivers 221 to 223 which receive signals from the isolation transformers Tr4 to Tr6 respectively, and a transmitter 224 which transmits a signal to the isolation transformer Tr7. The lower driver IC 22 further includes terminals T82 to T89.

The transmitters 23A to 23F all have a similar configuration, and here, FIG. 3 representatively shows a specific configuration of the transmitter 23A. The receivers 211 to 213 and 221 to 223 all have a similar configuration, and here, FIG. 3 representatively shows a specific configuration of the receiver 211.

Thus, a description will be given representatively of a configuration, as well as its operation, involving the transmitter 23A, the isolation transformer Tr1, and the receiver 211. The transmitter 23A includes an inverter 231, an inverter 232, a pulse generator 233, and a pulse generator 234. The input terminal of the inverter 231 is connected with the terminal T25. The output terminal of the inverter 231 is connected, along with the input terminal of the inverter 232, to the input terminal of the pulse generator 234. The output terminal of the inverter 232 is connected to the input terminal of the pulse generator 233. The output terminal of the pulse generator 233 is connected to one end of a primary-side winding of the isolation transformer Tr1 via the terminals T32 and T46. The output terminal of the pulse generator 234 is connected to the other end of the primary-side winding of the isolation transformer Tr1 via the terminals T33 and T47. The primary-side winding is connected, at a midpoint between the ends of the primary-side winding, to the ground potential via the terminal T60 and the external terminal T21.

The receiver 211 includes an inverter 211A, an inverter 211B, and a flip-flop 211C. One end of a secondary-side winding of the isolation transformer Tr1 is connected to the input terminal of the inverter 211A via the terminals T61 and T76. The other end of the secondary-side winding of the isolation transformer Tr1 is connected to the input terminal of the inverter 211B via the terminals T62 and T77. The secondary-side winding is connected, at a midpoint between the ends of the secondary-side winding, to the ground potential via the terminal T75 and the external terminal T8. The output terminal of the inverter 211A is connected to the set terminal S of the flip-flop 211C. The output terminal of the inverter 211B is connected to the reset terminal R of the flip-flop 211C. The output terminal Q of the flip-flop 211C is connected to the input terminal of the first driver 21A.

Figure 4:
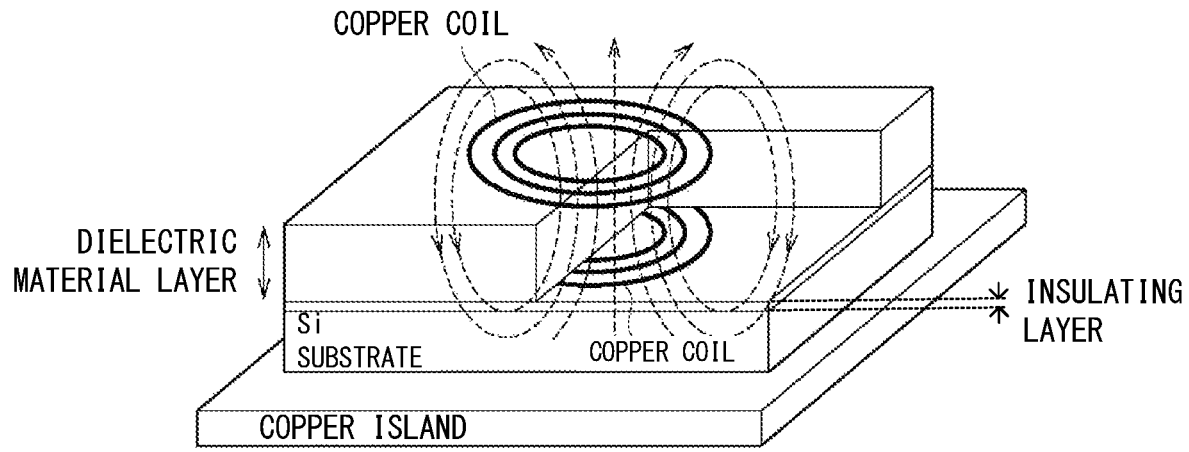
FIG. 4 is a diagram showing an example of a layered structure of an isolation transformer.

Here, FIG. 4 shows a layered structure of the isolation transformer Tr1 made into a chip. The rest of the isolation transformers, namely the isolation transformers Tr2 to Tr7 also have a similar structure. On a copper island, a silicon (Si) substrate (an example of an insulating substrate having a semiconductor layer) is formed. The silicon substrate has, on its obverse side, an insulating layer (such as a silicon oxide film). The silicon substrate may be any other dielectric member such as an insulating printed circuit board. On the surface of the silicon substrate or in the silicon substrate, a copper coil is formed as a primary-side winding or a secondary-side winding. The copper coil is laid, so as to be covered, with a dielectric material layer of, for example, SiO2. On the surface of the dielectric material layer or in the dielectric material layer, a copper coil is formed as a secondary-side winding or a primary-side winding. Thus, the primary-side copper coil and the secondary-side copper coil are electrically isolated from each other by the dielectric material layer. The other isolation transformers Tr2 to Tr7 are arranged side by side on the silicon substrate to the side of the isolation transformer Tr1. The thickness of the isolation transformers made into a chip is small, and they can be formed to have the substantially same thickness as those of other ICs; it is thus possible to make the thickness of the IPM 2 smaller than that of the conventional one. The primary-side winding or the secondary-side winding may be formed of aluminum wiring. Instead of placing the primary-side winding and the secondary-side winding over one another in the vertical direction, it is possible to arrange them on the same plane, side by side in the horizontal direction.

With reference back to FIG. 3, the control signal HINU which is a pulse signal fed in via the terminal T25 is fed to the inverter 231 to be inverted, is then inverted again by the inverter 232, and is then fed to the pulse generator 233. The signal having been inverted by the inverter 231 is fed also to the pulse generator 234. The pulse generator 233 and the pulse generator 234, by being triggered by a rising edge in the fed signal, generates a pulse signal having a width smaller than that of the control signal HINU, and outputs it to the primary side of the isolation transformer Tr1.

With a change in the electric current caused by the pulse signal fed to primary-side winding of the isolation transformer Tr1, an electric current occurs in the secondary-side winding of the isolation transformer Tr1, and is fed via the inverters 211A and 211B to the flip-flop 211C. According to the direction of the current passing through the secondary-side winding, whether to feed a high-level signal to the set terminal S or to feed a high-level signal to the reset terminal R is determined.

When the control signal HINU falls from high level to low level, the signal fed to the pulse generator 234 rises from low level to high level; thus, the pulse generator 234 generates a pulse and outputs it to the primary side of the isolation transformer tr1. In this case, a low-level signal is fed to the set terminal S of the flip-flop 211C, and a high-level signal is fed to the reset terminal R, and thus from the output terminal Q, a low-level control signal HOU is fed out to the first driver 21A.

On the other hand, when the control signal HINU rises from low level to high level, the signal fed to the pulse generator 233 rises from low level to high level; thus, the pulse generator 233 generates a pulse and outputs it to the primary side of the isolation transformer Tr1. In this case, a high-level signal is fed to the set terminal S of the flip-flop 211C, and a low-level signal is fed to the reset terminal R of the flip-flop 211C, and thus from the output terminal Q, a high-level control signal HOU is fed out to the first driver 21A.

In this way, the control signal HINU which is a pulse signal is transmitted via the transmitter 23A to the primary side of the isolation transformer Tr1, is then delivered to the receiver 211 while being electrically isolated by the isolation transformer Tr1, and is then transmitted as a control signal HOU to the upper driver IC 21 by the receiver 211.

In a similar manner, the control signal HINV which is a pulse signal fed in via the terminal 26 is transmitted via the transmitter 23B to the primary side of the isolation transformer Tr2, is then delivered to the receiver 212 while being electrically isolated by the isolation transformer Tr2, and is then transmitted as a control signal HOV to the second driver 21B by the receiver 212. In a similar manner, the control signal HINW which is a pulse signal fed in via the terminal T27 is transmitted via the transmitter 23C to the primary side of the isolation transformer Tr3, is then delivered to the receiver 213 while being electrically isolated by the isolation transformer Tr3, and is then transmitted as a control signal HOW to the third driver 21C by the receiver 213.

In a similar manner, the control signal LINU which is a pulse signal fed in via the terminal T28 is transmitted via the transmitter 23D to the primary side of the isolation transformer Tr4, is then delivered to the receiver 221 while being electrically isolated by the isolation transformer Tr4, and is then transmitted as a control signal LOU to the first driver 22A by the receiver 221. In a similar manner, the control signal LINV which is a pulse signal fed in via the terminal T29 is transmitted via the transmitter 23E to the primary side of the isolation transformer Tr5, is then delivered to the receiver 222 while being electrically isolated by the isolation transformer Tr5, and is then transmitted as a control signal LOV to the second driver 22B by the receiver 222. In a similar manner, the control signal LINW which is a pulse signal fed in via the terminal T30 is transmitted via the transmitter 23F to the primary side of the isolation transformer Tr6, is then delivered to the receiver 223 while being electrically isolated by the isolation transformer Tr6, and is then transmitted as a control signal LOW to the third driver 22C by the receiver 223.

Next, a description will be given of a configuration, as well as its operation, involving the transmitter 224, the isolation transformer Tr7, and the receiver 23G. The transmitter 224 includes an inverter 224A, an inverter 224B, and a pulse generator 224C, and a pulse generator 224D. To the input terminal of the inverter 224A, a fault signal FIN is fed.

The output terminal of the inverter 224A is connected, along with the input terminal of the inverter 224B, to the input terminal of the pulse generator 224D. The output terminal of the inverter 224B is connected to the input terminal of the pulse generator 224C. The output terminal of the pulse generator 224C is connected via the terminals T88 and T73 to one end of a primary-side winding of the isolation transformer Tr7. The output terminal of the pulse generator 224D is connected via the terminals T89 and T74 to the other end of the primary-side winding of the isolation transformer Tr7.

The receiver 23G includes an inverter 236, an inverter 237, and a flip-flop 235. One end of the secondary-side winding of the isolation transformer Tr7 is connected via the terminals T58 and T44 to the input terminal of the inverter 236. The other end of the secondary-side winding of the isolation transformer Tr7 is connected via the terminals T59 and T45 to the input terminal of the inverter 237. The output terminal of the inverter 236 is connected to the set terminal S of the flip-flop 235. The output terminal of the inverter 237 is connected to the reset terminal R of the flip-flop 235. The output terminal Q of the flip-flop 235 is connected to the terminal T31. The terminal 31 is connected to the external terminal T20 (FIG. 2).

That is, the configuration involving the transmitter 224, the isolation transformer Tr7, and the receiver 23G is similar to the above-described configuration involving the transmitter 23A, the isolation transformer Tr1, and the receiver 211. Thus, the fault signal FIN is transmitted via the transmitter 224 to the primary side of the isolation transformer Tr7, and is then delivered to the receiver 23G while being electrically isolated by the isolation transformer Tr7, and is then transmitted as a fault signal FO via the terminal T31 and the external terminal T20 to the MCU 1 (FIG. 1) by the receiver 23G.

<Configuration of a Semiconductor Package>

Figure 5:
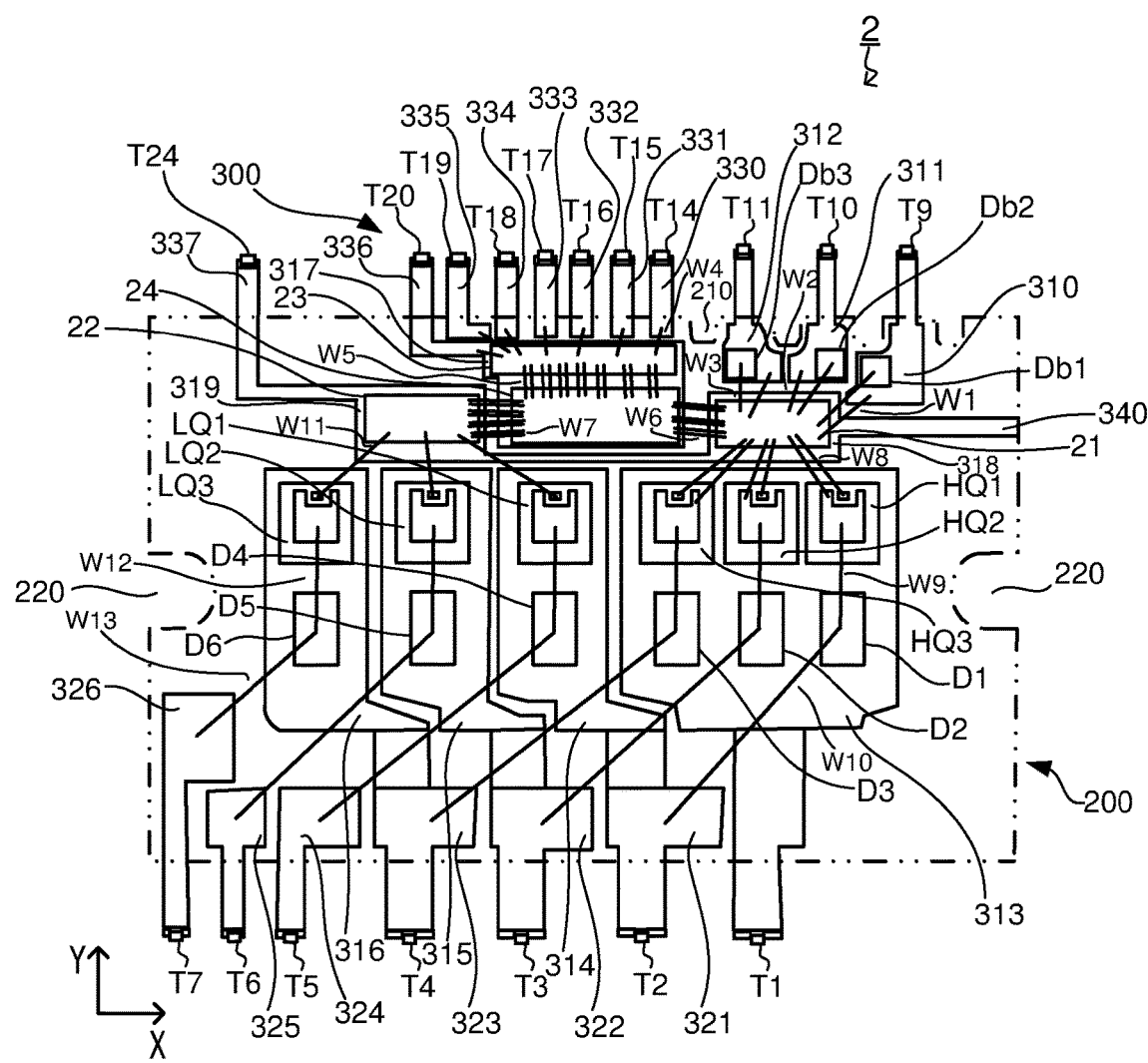
FIG. 5 is a schematic plan view of an IPM (semiconductor package) according to one embodiment of the present invention.

Next, the configuration of the IPM 2 as a semiconductor package according to this embodiment will be described in detail with reference to FIG. 5. FIG. 5 is a plan view of the IPM 2 (semiconductor package) as seen from a side thereof on which the IPM 2 is mounted. In FIG. 5, for the sake of convenience, sealing resin 200 is indicated by a dash-dot-dot line. The sealing resin 200 is so formed as to have a substantially rectangular outline.

The IPM 2 shown in FIG. 5 includes sealing resin 200, a lead frame 300, an upper driver IC 21, a lower driver IC 22, a transmission-reception IC 23, an insulator 24, bootstrap diodes Db1 to Db3, a first upper switching device HQ1, a second upper switching device HQ2, a third upper switching device HQ3, a first lower switching device LQ1, a second lower switching device LQ2, a third lower switching device LQ3, diodes D1 to D6, and wires W1 to W13. In the sealing resin 200 (package), the insulator 24 and the drivers (the upper driver IC 21 and the lower driver IC 22) are sealed, and here, at least part of the silicon substrate (FIG. 4) is sealed.

The lead frame 300 includes islands 310 to 319, lead-terminal pads 321 to 326, lead terminals 330 to 337, and a suspension lead 340. The lead frame 300 is formed of, for example, metal such as Cu. The lead frame 300 is formed, for example, by subjecting a metal sheet material to a cutting process such as punching and a bending process.

On the island 310 integrated with the external terminal T9, the diode Db1 is placed. The anode side of the diode Db1 and a terminal of the upper driver IC 21 are connected together via a wire W1, and the island 310 and a terminal of the upper driver IC 21 are connected together via a wire W1. The wires W1 to W13 including the wires W1 are, for example, Au wires. Instead, the wires W1 to W13 may be, for example, Al or Cu wires, or may each comprise a plurality of wires connected in parallel, or may be wires in the form of flat sheets. On the island 311 integrated with the external terminal T10, the diode Db2 is placed. The anode side of the diode Db2 and a terminal of the upper driver IC 21 are connected together via a wire W2, and the island 311 and a terminal of the upper driver IC 21 are connected together via a wire W2. On the island 312 integrated with the external terminal T11, the diode Db3 is placed. The anode side of the diode Db3 and a terminal of the upper driver IC 21 are connected together via a wire W3, and the island 312 and a terminal of the upper driver IC 21 are connected together via a wire W3.

The lead terminals 330 to 336 including the external terminals T14 to T20 respectively are connected to the terminals T25 to T31 of the transmission-reception IC 23 respectively, each via a wire W4 (that is, there are a total of seven wires W4). In a plan view, the insulator 24 is arranged at a position between the upper driver IC 21 and the lower driver IC 22. The terminals T32 to T45 of the transmission-reception IC 23 are connected to the terminals T46 to T59 of the insulator 24 respectively, each via a wire W5 (that is, there are a total of fourteen wires W5).

The terminals T61 to T66 of the insulator 24 are connected to the terminals T76 to T81 of the upper driver IC 21 respectively, each via a wire W6 (that is, there are a total of six wires W6). The terminals T67 to T74 of the insulator 24 are connected to the terminals T82 to T89 of the lower driver IC 22 respectively, each via a wire W7 (that is, there are a total of eight wires W7).

On the island 313 integrated with the external terminal T1, the upper switching devices HQ1 to HQ3 and the diodes D1 to D3 are placed. Terminals of the upper driver IC 21 are connected to the gates and emitters of the upper switching devices HQ1 to HQ3 respectively, each via a wire W8. The emitters of the upper switching devices HQ1 to HQ3 are connected the anodes of the diodes D1 to D3 respectively, each via a wire W9. The emitters of the diodes D1 to D3 are connected, respectively, to the pads 321 to 323 integrated with the external terminals T2 to T4 respectively, each via a wire W10.

On the island 314 integrated with the pad 321, the first lower switching device LQ1 and the diode D4 are placed. On the island 315 integrated with the pad 322, the second lower switching device LQ2 and the diode D5 are placed. On the island 316 integrated with the pad 323, the third lower switching device LQ3 and the diode D6 are placed.

Terminals of the lower driver IC 22 are connected to the gates of the lower switching devices LQ1 to LQ3 respectively, each via a wire W11. The emitters of the lower switching devices LQ1 to LQ3 are connected to the anodes of the diodes D4 to D6 respectively, via a wire W12. The emitters of the diodes D4 to D6 are connected, respectively, to the pads 324 to 326 integrated with the external terminals T5 to T7 respectively, each via a wire W13.

The island 317 on which the transmission-reception IC 23 and the insulator 24 are placed is integrated with the lead terminal 336. The island 319 on which the lower driver IC 22 is placed and the island 318 on which the upper driver IC 21 is placed are connected and integrated together. The island 319 is integrated with the lead terminal 337. The lead terminal 337 includes the external terminal T24. The island 318 is integrated with the suspension lead 340.

In FIG. 5, a lead frame which includes the external terminal T21 is not illustrated. This lead frame is a low voltage-side ground terminal. The unillustrated lead frame is, in the same group as lead frames including the external terminals T14 to T20 which are likewise on the low-voltage side, arrayed in the X direction.

The interval between lead frames adjacent in the X direction in a group (first group) comprising lead frames including the external terminals T9 to T11 at which a relatively high voltage occurs is larger than the interval between lead frames adjacent in the X direction in a group (second group) comprising the external terminals T14 to T21. The interval between the first group and the second group is larger than the interval between lead frames adjacent in the X direction in the second group. Between lead frames adjacent in the X direction in the first group and between the first and second groups, grooves 210 which are formed in the sealing resin 200 and which are dented in the Y direction are each arranged. Substantially in the middle of each of opposite sides of the sealing resin 200 in the X direction, a groove 220 dented in the X direction is formed. The grooves 220 are used, for example, for the conveying and fitting of the IPM 2.

Lead frames including the external terminals T1 to T7 at which a relatively high voltage occurs are arrayed in the X direction at one side of the sealing resin 200 opposite from another side of the sealing resin 200 in the Y direction at which the lead frames of the first and second groups are arranged. Although the external terminal T8 is not illustrated in FIG. 5, a lead frame which includes the external terminal T8 is arranged in the same group as the lead frames including the external terminals T1 to T7. The lead terminal 337, which is a high voltage-side ground terminal, is arranged at an interval, which is larger than the interval between lead frames adjacent in the X direction in the second group, from the second group.

Effects Provided in this Embodiment

With the IPM 2 according to this embodiment, owing to the provision, inside the IPM 2 (semiconductor device), of the transmission-reception IC 23 and the insulator 24, of which the latter can be formed with a smaller area and thickness than one using a plurality of photocouplers, signal isolation for the control signals and the fault signal is achieved inside the IPM 2. Thus, even if the size of the IPM 2 is made slightly larger by providing the transmission-reception IC 23 and the insulator 24, the elimination of photocouplers exerts a stronger effect on the reduction of the mounting area; thus, it is possible to significantly reduce the mounting area on the printed circuit board as a whole as shown in FIG. 1. Thus, it is possible to reduce the size of the printed circuit board 3, and thus to contribute to the reduction of the size of the inverter system 10. In the configuration of the package of the IPM 2, in which the insulator 24 which can be formed small, even when the insulator 24 is arranged at a position between the upper driver IC 21 and the lower driver IC 22, these ICs can be aligned along and within a long side of the IPM 2; it is thus possible to reduce as much as possible the lengths of both of the wires W6 and W7 which connect between the insulator 24 and the upper driver IC 21 and between the insulator 24 and the lower driver IC 22. Thus, it is possible to reduce the lengths of the wires to a possible extent, and to reduce the danger of the wires short-circuiting together when they are sealed with resin, and it is also possible to manufacture at low cost.

An example of the effects obtained by incorporating an isolation function in the IPM 2 is that, since low-voltage terminals and high-voltage terminals are generally arranged away from each other in the semiconductor package used in the IPM 2, there is no need to give consideration to a terminal creepage distance as with a package including photocouplers. For another example, while, with the configuration involving photocouplers, it is necessary to secure a distance between wiring patterns on the substrate to prevent electric discharge in the air, in this embodiment, internal isolation is achieved with sealing resin used in the package of the IPM 2, and the permittivity of resin is lower than that of air; thus it is possible to achieve space saving. Although sealing the photocouplers with resin inside the package of the IPM 2 eliminates problems related to isolation, there still remain problems with respect to the thickness of the photocouplers and a poor prospect of success in reducing the area occupied by the photocouplers.

<Application to an Industrial Device>

Figure 6:
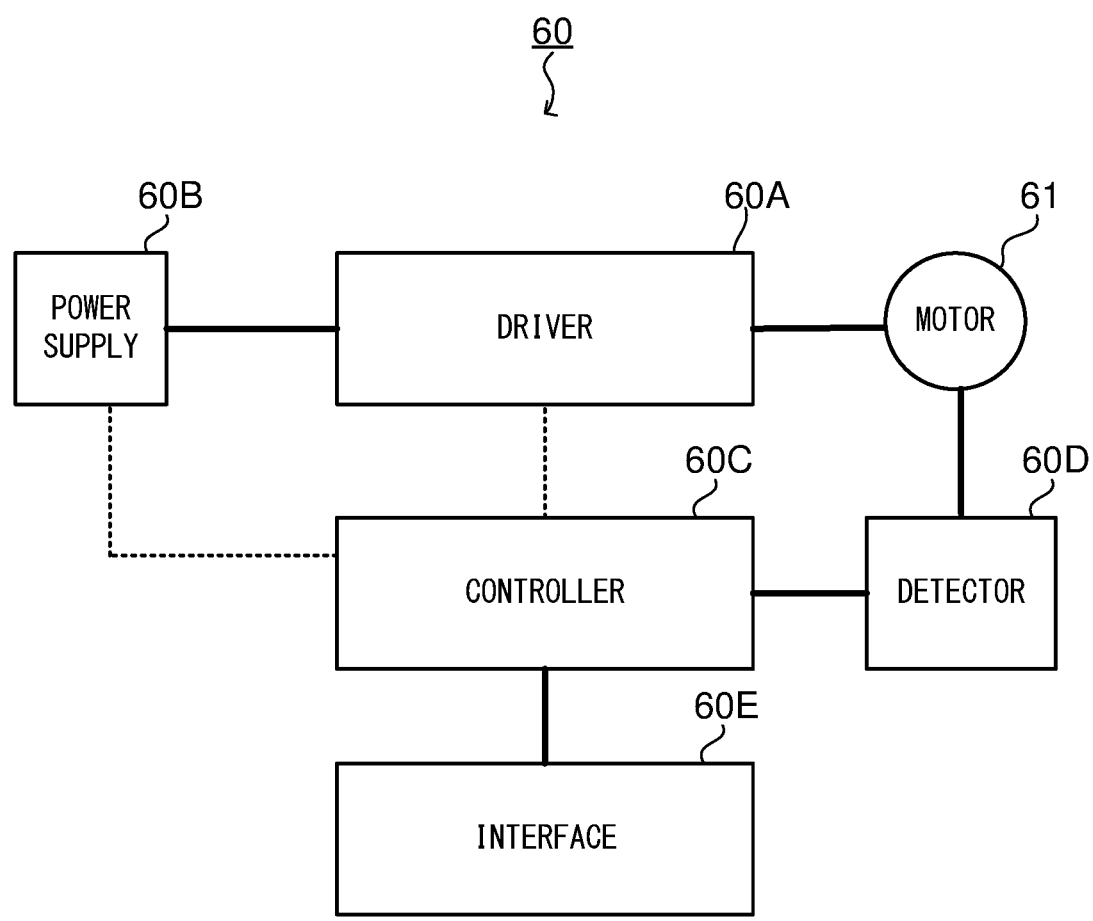
FIG. 6 is a block diagram showing an outline of one configuration example of a motor driving system.

Next, as one example of application of the IPM according to the present invention, application to an industrial device will be described. FIG. 6 is a block configuration diagram showing an outline of an example of a motor driving system for FA (factory automation). The motor driving system 60 shown in FIG. 6 is a system for driving a motor 61. The motor 61 is incorporated, for example, in an industrial robot. The motor driving system 60 includes a driver 60A, a power supply 60B, a controller 60C, a detector 60D, and an interface 60E.

The driver 60A includes a power device, a gate driver, or the like and is a block which practically drives the motor 61. The power supply 60B includes an AC-DC converter, a DC-DC converter, or the like, and generates electric power to feed it to the driver 60A, etc. The controller 60C includes an MCU, or the like, and controls the driver 60A, the power supply 60B, etc. The detector 60D is a sensor which senses the rotation position and the rotation speed of the motor 61. The interface 60E comprises a serial communication interface, Bluetooth (registered trademark), or the like. The IPM according to the present invention is applicable to the driver 60A.

<Application to a Solar Power Generation System>

Figure 7:
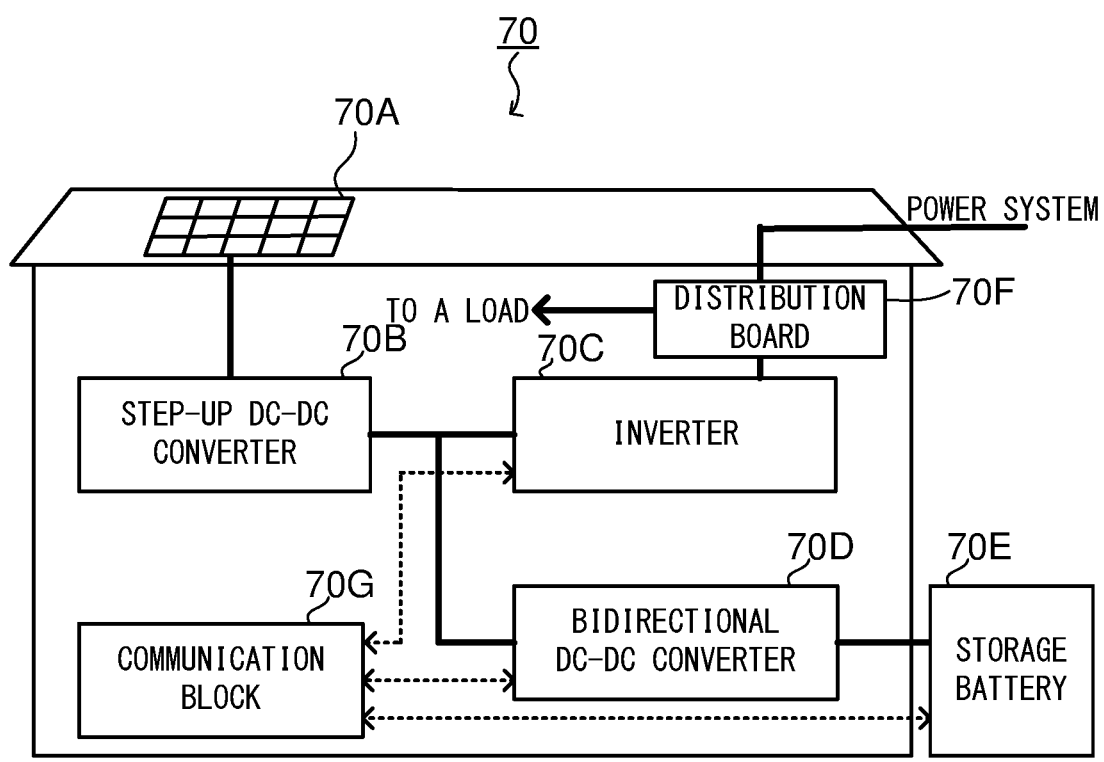
FIG. 7 is a block diagram showing an outline of one configuration example of a solar power generation system.

Next, as another example of application of the IPM according to the present invention, application to a solar power generation system will be described. FIG. 7 is a block configuration diagram showing an outline of an example of a solar power generation system. The solar power generation system 70 shown in FIG. 7 includes a solar battery array 70A, a step-up DC-DC converter 70B, an inverter 70C, a bidirectional DC-DC converter 70D, a storage battery 70E, a distribution board 70F, and a communication block 70G.

The solar battery array 70A has a plurality of solar battery modules connected together, and receives sunlight to generate DC power. The step-up DC-DC converter 70B generates a predetermined DC voltage by stepping up a DC voltage fed from the solar battery array 70A. The inverter 70C converts the DC power from the step-up DC-DC converter 70B into AC power, and outputs it to the distribution board 70F. The distribution board 70F feeds necessary power out of the power from the inverter 70C to a load (for example, an electric appliance in a household), and outputs surplus power to a commercial system. The power fed from the commercial system can also be fed to a load via the power distribution board 70F. The bidirectional DC-DC converter 70D converts the DC power fed from the step-up DC-DC converter 70B into predetermined DC power, and makes the storage battery 70E store the DC power. Also, the bidirectional DC-DC converter 70D performs DC-DC conversion on the power discharged from the storage battery 70E, and feeds it to a load via the inverter 70C and the distribution board 70F. The communication block 70G communicates with the inverter 70C, the bidirectional DC-DC converter 70D, and the storage battery 70E, etc. The IPM according to the present invention is applicable to the inverter 70C, the step-up DC-DC converter 70B, etc.

<Application to a Vehicle>

Figure 8:
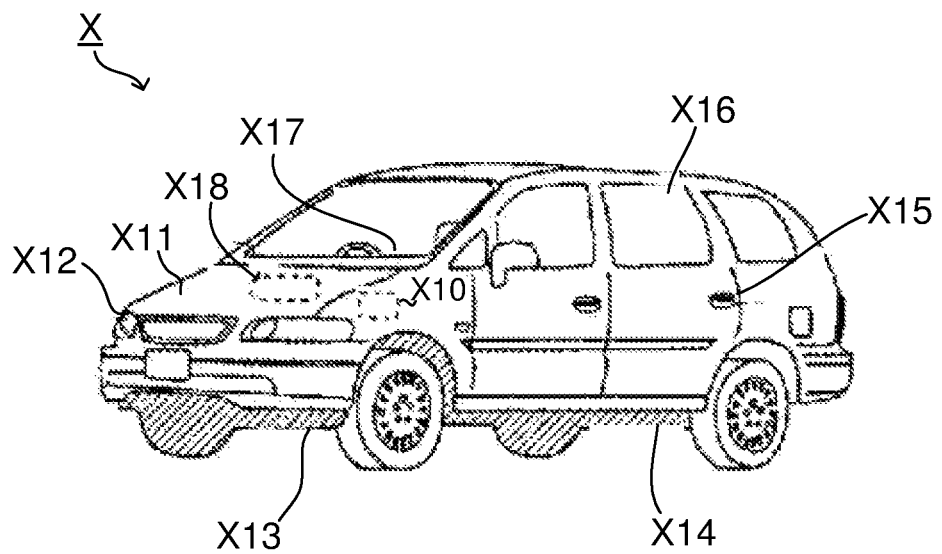
FIG. 8 is an exterior view showing one example of a vehicle incorporating electronic appliances.
Figure 9:
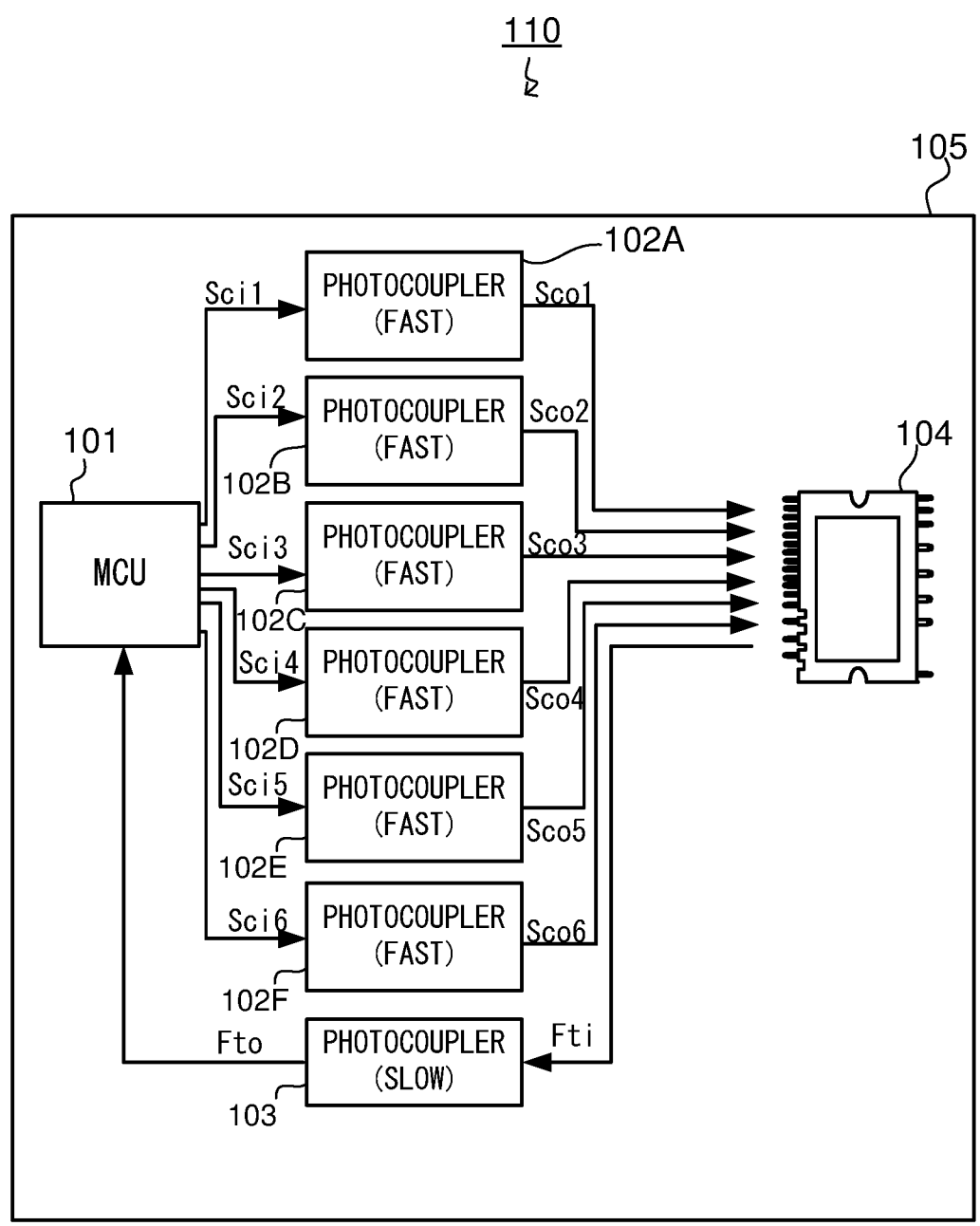
FIG. 9 is a diagram showing an outline of a configuration of an inverter system according to a conventional example.

Next, as an example of application of the IPM according to this embodiment, application to a vehicle will be described. FIG. 8 is an exterior view showing one configuration example of a vehicle incorporating various electronic appliances. The vehicle X of this configuration example incorporates a battery X10, and various electronic appliances X11 to X18 that operate by being fed with an input voltage from the battery X10. It should be noted that, for the sake of convenient illustration, in FIG. 8, any of the battery X10 and the electronic appliances X11 to X18 may be located elsewhere in practice.

The electronic appliance X11 is an engine control unit which performs control with respect to an engine (injection control, electronic throttle control, idling control, oxygen sensor heater control, automatic cruise control, etc.).

The electronic appliance X12 is a lamp control unit which controls the lighting and extinguishing of HIDs (high-intensity discharged lamps) and DRLs (daytime running lamps).

The electronic appliance X13 is a transmission control unit which performs control with respect to a transmission.

The electronic appliance X14 is a body control unit which performs control with respect to the movement of the vehicle X (ABS (anti-lock brake system) control, EPS (electric power steering) control, electric suspension control, etc.).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, as A/V (audio/visual) equipment, a car navigation system, and an ETC (electronic toll collection system).

The electronic appliance X18 comprises electronic appliances provided with high-withstand-voltage motors, such as a vehicle-mounted blower, an oil pump, a water pump, and a battery cooling fan.

The inverter system including the IPM according to the present invention can be built into any of those of the electronic appliances X11 to X18 that use a motor or include a power supply.

<Modifications>

The present invention may be implemented in any other manner than in the embodiments specifically described above, and allows for many modifications and variations within the spirit of the invention. It should be understood that the embodiments disclosed herein are in every aspect illustrative and not restrictive, and that the technical scope of the present invention is defined not by the description of embodiments given above but by the scope of the appended claims and encompasses any modification in the sense and scope equivalent to those of the claims. For example, the island 317 may be a member separate from the lead terminal 336, and likewise the islands 318 and 319 may each be a separate member. As the island 317, an insulating printed circuit board may be used, and on the printed circuit board, a transmission-reception IC, an insulator, an upper driver IC, and a lower driver IC may be mounted.

INDUSTRIAL APPLICABILITY

The present invention finds application in, for example, inverter systems for driving a motor in an industrial device and for converting power of a power supply.

LIST OF REFERENCE SIGNS

1 MCU
2 IPM
3 printed circuit board
10 inverter system
15 motor
21 upper driver IC
22 lower driver IC
23 transmission-reception IC
24 insulator
200 sealing resin
210, 220 groove
300 lead frame
310 to 319 island
321 to 326 pad
330 to 337 lead terminal
340 suspension lead
W1 to W13 wire
HQ1 first upper switching device
HQ2 second upper switching device
HQ3 third upper switching device
LQ1 first lower switching device
LQ2 second lower switching device
LQ3 third lower switching device
D1 to D6 diode
Db1 to Db3 diode
Cb1 to Cb3 capacitor
R1 resistor
T1 to T24 external terminal
T25 to T75 terminal
Tr1 to Tr7 isolation transformer
23A to 23F transmitter
23G receiver
211 to 213, 221 to 223 receiver
224 transmitter
60 motor driving system
60A driver
60B power supply
60C controller
60D detector
60E interface
61 motor
70 solar power generation system
70A solar battery array
70B step-up DC-DC converter
70C inverter
70D bidirectional DC-DC converter
70E storage battery
70F distribution board
70G communication block
X vehicle
X10 battery
X11 to X18 electronic appliance

The invention claimed is:

1. A semiconductor device, comprising:
a transmission-reception IC;
an insulator;
a driver chip;
an upper switching device;
a lower switching device;
a first metal island on which the upper switching device is mounted;
a second metal island on which the lower switching device is mounted; and
a package,
wherein
a part of the first metal island on which the upper switching device is mounted extends out of the package,
a control signal is received by the transmission-reception IC and is then delivered to the insulator so that the control signal, while being electrically insulated by the insulator, is transmitted to the driver chip, and
the driver chip is configured to drive the upper and lower switching devices based on the control signal.

2. The semiconductor device according to claim 1, further comprising:
a first protective element configured to protect the upper switching device; and
a second protective element configured to protect the lower switching device.

3. The semiconductor device according to claim 1, wherein the upper and lower switching devices are each an insulated-gate bipolar transistor (IGBT) or metal-oxide-semiconductor field-effect transistor (MOSFET) with a Si substrate or an IGBT or MOSFET with a SiC substrate or a wide-band-gap semiconductor substrate.

4. The semiconductor device according to claim 1, wherein the upper and lower switching devices are connected in series to constitute a bridge circuit.

5. The semiconductor device according to claim 1, wherein the transmission-reception IC and the insulator are arranged on a same island.

6. The semiconductor device according to claim 2, wherein
the upper switching device comprises a plurality of upper switching devices,
the lower switching device comprises a plurality of lower switching devices,
the first protective element comprises a plurality of first protective elements,
the second protective element comprises a plurality of second protective elements,
the lower switching devices and the corresponding ones of the second protective elements are provided in pairs, with plural second metal islands being provided and each pair being mounted on a separate one of the second metal islands, and
the plurality of upper switching devices are placed on a same island.

7. The semiconductor device according to claim 6, wherein
the driver chips are provided separately, each being configured to drive one of the upper switching device and the lower switching device.

8. The semiconductor device according to claim 7, wherein
the separately provided driver chips are each mounted on a separate one of a plurality of third metal islands.

9. The semiconductor device according to claim 8, further comprising:
a fourth metal island on which the insulator is mounted.

10. The semiconductor device according to claim 7, wherein the insulator is arranged in a region between an upper driver chip and a lower driver chip as seen in a plan view.

11. The semiconductor device according to claim 9, further comprising:
a bootstrap diode.

12. The semiconductor device according to claim 11, wherein
the bootstrap diode comprises a plurality of bootstrap diodes, each of which is mounted on a separate one of a plurality of fifth metal islands.

13. The semiconductor device according to claim 12, further comprising:
a sixth metal island on which the transmission-reception IC is mounted.

14. A semiconductor device, comprising:
a transmission-reception IC;
an insulator;
a driver chip;
an upper switching device;
a lower switching device;
a first metal island on which the upper switching device is mounted;
a second metal island on which the lower switching device is mounted; and
a package,
wherein
a part of the first metal island on which the upper switching device is mounted extends out of the package,
an extending portion included in the first metal island is used as a terminal,
a control signal is received by the transmission-reception IC and is then delivered to the insulator so that the control signal, while being electrically insulated by the insulator, is transmitted to the driver chip, and
the driver chip is configured to drive the upper and lower switching devices based on the control signal.

15. The semiconductor device according to claim 14, further comprising:
a first protective element configured to protect the upper switching device; and
a second protective element configured to protect the lower switching device.

16. The semiconductor device according to claim 14, wherein the upper and lower switching devices are each an insulated-gate bipolar transistor (IGBT) or metal-oxide-semiconductor field-effect transistor (MOSFET) with a Si substrate or an IGBT or MOSFET with a SiC substrate or a wide-band-gap semiconductor substrate.

17. The semiconductor device according to claim 14, wherein the upper and lower switching devices are connected in series to constitute a bridge circuit.

18. The semiconductor device according to claim 14, wherein the transmission-reception IC and the insulator are arranged on a same island.

19. The semiconductor device according to claim 15, wherein
the driver chips are provided separately, each being configured to drive one of the upper switching device and the lower switching device.

20. The semiconductor device according to claim 19, wherein
the separately provided driver chips are each mounted on a separate one of a plurality of third metal islands.

21. The semiconductor device according to claim 20, further comprising:
a fourth metal island on which the insulator is mounted.

22. The semiconductor device according to claim 19, wherein the insulator is arranged in a region between an upper driver chip and a lower driver chip as seen in a plan view.

23. The semiconductor device according to claim 21, further comprising:
a bootstrap diode.

24. The semiconductor device according to claim 23, wherein
the bootstrap diode comprises a plurality of bootstrap diodes, of which each is mounted on a separate one of a plurality of fifth metal islands.

25. The semiconductor device according to claim 24, further comprising:
a sixth metal island on which the transmission-reception IC is mounted.

26. The semiconductor device according to claim 25, wherein
the upper switching device comprises a plurality of upper switching devices,
the lower switching device comprises a plurality of lower switching devices,
the first protective element comprises a plurality of first protective elements,
the second protective element comprises a plurality of second protective elements, and
the lower switching devices and the corresponding ones of the second protective elements are provided in pairs, with plural second metal islands being provided and each pair being mounted on a separate one of the second metal islands.

* * * * *